United States Patent [19]
Meinema

[11] 3,938,063
[45] Feb. 10, 1976

[54] CASCADE COUPLED COILED SPRING REVERBERATION MEANS

[76] Inventor: Herbert E. Meinema, 2231 Holly Ave., Escondido, Calif. 92027

[22] Filed: Feb. 27, 1975

[21] Appl. No.: 553,830

[52] U.S. Cl. ................ 333/30 R; 84/1.25; 179/1 J; 333/71
[51] Int. Cl.² ...................... H03H 9/30; H10H 1/02
[58] Field of Search .......... 333/29, 30 M, 30 R, 71; 84/1.01, 1.05, 1.06, 1.24, 1.26; 310/8.3, 8.4, 8.5, 8.6; 179/1 J, 1 M

[56] References Cited

UNITED STATES PATENTS

| | | | |
|---|---|---|---|
| 3,307,055 | 2/1967 | Schaft | 333/30 R X |
| 3,363,202 | 1/1968 | Meinema | 333/30 R |
| 3,564,462 | 11/1968 | Fidi et al. | 333/30 R |
| 3,611,202 | 10/1971 | Van Leer | 333/30 R |

*Primary Examiner*—James W. Lawrence
*Assistant Examiner*—Marvin Nussbaum
*Attorney, Agent, or Firm*—Laurence R. Brown

[57] ABSTRACT

At least two coil spring rotational mode reverberation lines having transducers at two remote ends thereof are coupled in cascade circuit by means of intermediate long wire transverse mode line structure. Thus, two (or more) coils may be located side by side with a long thin wire coupling opposite ends of the coils, thereby considerably reducing packaging size of long time delay reverberation lines, and producing coupling means that is less susceptible to physical shock. The wire comprises universal type coupling means for coupling together coils of different characteristics.

10 Claims, 3 Drawing Figures

CASCADE COUPLED COILED SPRING REVERBERATION MEANS

This invention relates to reverberation devices and more particularly it relates to means coupling two coiled spring type acoustical transmission lines.

BACKGROUND OF THE INVENTION

Coiled spring type acoustical transmission lines commonly called artificial reverberation lines, which convey acoustical signals in the rotary transmission mode are well known. Examples are U.S. Pat. No. 2,982,819 issued to H. E. Meinema et al., May 2, 1961; U.S. Pat. No. 3,363,202 issued to H. E. Meinema, Jan. 9, 1968; and U.S. Pat. No. 3,106,610 issued to A. C. Young, Oct. 8, 1963.

Although the prior art is well developed there are several major deficiencies present. One significant deterrent to use of such lines in modern miniaturized equipment is the large overall packaging size necessary in the lines to obtain the necessary reverberation characteristics. Thus, the lines may take up more room than the amplifier and signal processing electronic equipment in which they are used.

Prior art attempts made to shorten lines by folding them at the center have introduced various problems in the suspension of the line and coupling of signals as shown by Meinema U.S. Pat. No. 3,363,202; U.S. Pat. No. 3,564,462 issued Feb. 16, 1971 to W. Fidi et al.; or U.S. Pat. No. 3,431,516 issued Mar. 4, 1969 to H. W. Schafft et al. Such lines require special engineering construction of the coupling networks for different delays or line characteristics. If this is not done the coupling means may introduce distortions such as high frequency attenuation. Also matching of different length or different diameter spring line segments is difficult. Thus, construction techniques are not uniform and lines may become too costly to employ. Also, such folded lines of the prior art are susceptible to shock forces applied transverse to the coil spring axis, which tends to introduce rotational motion and thus introduces noise into output signals.

OBJECTS OF THE INVENTION

It is therefore a general object of this invention to provide an improved spring type acoustical line.

A more specific object of the invention is to provide a more compact line package.

Another object of the invention is to provide a coupling technique between two coil spring line segments that is adaptable to a large range of line characteristics.

A further object of the invention is to provide inexpensive reverberation lines that can be readily manufactured.

A still further object of the invention is to provide reverberation lines with broad frequency band characteristics useful in high fidelity music reproduction systems.

Other objects, features and advantages of the invention will be found throughout the following description of the invention.

BRIEF DESCRIPTION OF THE INVENTION

Thus, in accordance with this invention, at least two coil springs are cascade coupled into a reverberation line having a transducer introducing acoustic energy in a rotational mode into a first spring and a transducer deriving acoustical energy from a terminal spring from the rotational mode therein. The springs may be of the same or different lengths and of the same or different physical characteristics. A thin long wire adapted to transmit transverse wave motion serves as a coupling medium between two springs. An end terminal on the springs rotates generally about the spring axis with rotational vibration in the spring, and extending from this terminal is a substantially normal length of the wire which serves as transition means from the rotational mode in the spring to the transverse mode in the wire. At each coupling a thin wire compliance member is connected to the frame along the spring axis to contain the line physically while permitting the rotational wave transmission therein.

The coupling wire has inertia and elasticity serving in the manner of a long rope under slight tension with one end fastened to a rigid support to generate transverse waves moving therealong in response to oscillatory motion at the free end. The waves at the far end are coupled to induce rotational wave motion in the second spring. The coupling wire is made long and thin with a length very long in relation to its diameter.

For minimum space packaging the coil springs are of equal length and in parallel side-by-side relationship with the coupling long thin wire member connecting opposite ends of adjacent springs. Thus the wire parallels the springs for a greater part of its length.

THE DRAWING

In the drawing, wherein like reference characters indicate similar parts throughout the several views, FIG. 1 is a plan view of a preferred reverberation line embodiment of the invention;

FIG. 2 is a detailed, enlarged partial view of the coupler at one end joining the frame, coil spring and coupling link with a compliance mount that permits the transition between rotational and transverse wave motion; and FIG. 3 is a foreshortened partial view of a coupler embodiment of the invention between two coil springs of different physical characteristics.

DETAILED DESCRIPTION OF THE INVENTION

Figure 1:
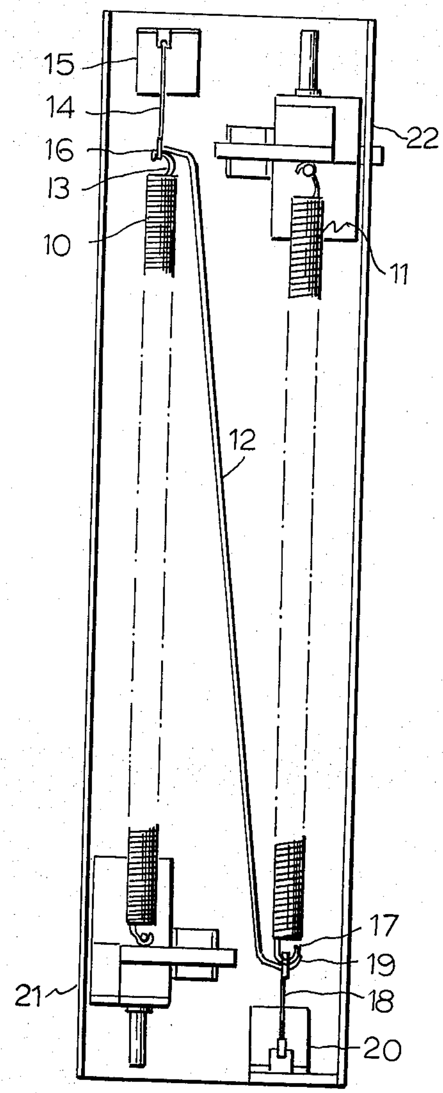
Figure 3:
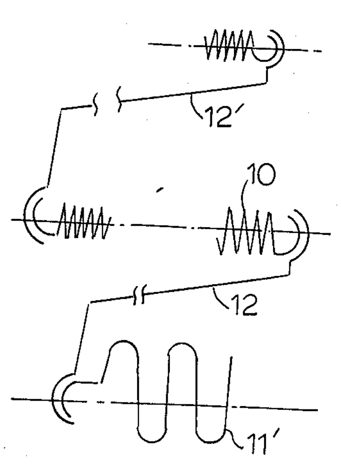

FIG. 1 shows the overall delay line arrangement where two side-by-side parallel coil springs 10 and 11 of substantially similar physical properties are coupled by a long thin wire 12. As seen from FIG. 3, the lines may include more coil springs and may have springs of different physical size, shape or length. As may be seen from the view of FIG. 1, the line may be short and compact while giving required delay times by use of appropriate spring design.

The two remote ends of the delay line are coupled to electromechanic transducers 21, 22 in a conventional manner to send and receive acoustic signals.

Figure 2:
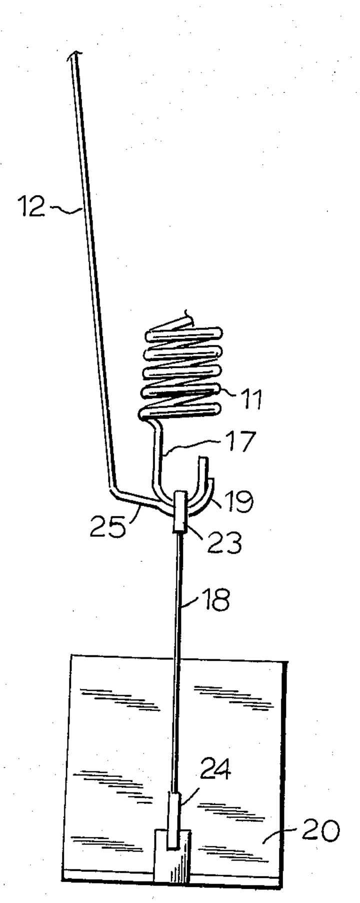

FIG. 2 shows the details of the compliance mount structure at support brackets 15 and 20 mounted on a frame assembly in FIG. 1 along with brackets for the transducers 21 and 22. The compliance is a thin wire that freely permits rotational wave motion in the springs 10 or 11 while mechanically securing the ends of the springs to the frame assembly.

The long thin wire 12 has extending substantially normally from the axis of the spring 11 a portion 25 which at the terminal end is affixed at coupling means junction 19 to the hook portion 17 at the terminal end of spring 11. The compliance terminal end 23, the hook 17 and the wire portion 25 are therefore connected firmly together, by soldering, welding, crimping or other means to provide a coupling junction for transmitting acoustic waves in the delay line between the spring 11 and wire 12 in either direction.

Compliance wire 18 has small metal sleeves 23 and 24 slid over the ends of the wire and flattened and bent to form hooks at the end to engage bracket 20 and the coupling junction 19. The compliance wire 18 has a diameter and mass so small compared to that of spring 11 that the spring hook 17 will be able to freely rotate about the axis of spring 11.

Similar coupling structure is used for coupling the other end of long thin wire 12 to line 10 as seen in FIG. 1 by reference to corresponding bracket 15, compliance wire 14, hook 13 and coupling junction 16.

THE OPERATIONAL MODE

In operation acoustic signals are introduced at one end of the line such as at transducer 21 and are recovered at the other end such as at transducer 22. The operation and physical construction of such transducers is conventional and need not be described in detail. They preferably include damping means for determining the rate of decay of signals. The sending transducer converts electrical signals into physical signals with a rotational mode of wave transmission in the delay coil spring 10. The physical rotational signals reaching the terminal end of coil spring 11 are by transducer 22 reconverted to electrical signals, which constitute the original signals delayed in time.

At coupling junction 16, the rotational signals are converted in wire 12 to transverse wave motion. The wire 12 is long and thin with proper inertia and elasticity to operate in the type of motion of a long rope under slight tension fastened at one end to a rigid support. Thus, when oscillatory motion is introduced at the free end transverse waves are generated which move therealong to the far end. There at coupling junction 19 the transverse waves are reconverted into rotational wave motion in spring 11. In order to enhance the development of transverse wave motion in the coupling wire 12, it is made as long as possible in relation to its diameter.

For the latter reason the springs 10 and 11 (or more) are preferably arranged in parallel side-by-side arrangement with the coupling wire 12 extending along the length thereof from one end to the other, as shown in FIG. 1, and substantially parallel thereto for a substantial portion of their length.

In operation the performance and response of this line has been found equivalent to a longer straight spring line. Therefore the compactness and simplicity is accomplished without serious distortion of the signal transmission characteristics, and the state of the art is improved.

Having therefore set out a preferred embodiment of the invention, those novel features believed descriptive of the spirit and scope of the invention are set forth with particularity in the appended claims.

What is claimed is:

1. An artificial reverberation line comprising in combination, at least two coil springs coupled into said line in cascade from a first spring to a terminal spring, transducer means for introducing acoustic energy into the first spring in a rotational mode, transducer means for deriving acoustic energy in the rotational mode from the terminal spring, and transverse wave motion transmission means coupled between a selected two of said springs in said line with first coupling means to convert said rotational mode energy from one spring and transmit it in the transverse wave motion mode and second coupling means to transfer the transverse wave motion into the rotational mode into said other spring.

2. A line as defined in claim 1, wherein said transverse wave motion means comprises a long thin wire.

3. A line as defined in claim 2, wherein said selected two said springs are arranged substantially side-by-side in parallel arrangement and said wire extends between the springs from one end to the other.

4. A line as defined in claim 2, wherein each said coupling means comprises a portion of said wire extending substantially normally to the axis of the spring to which the coupling means is respectively coupled.

5. A line as defined in claim 4, wherein the line is supported in a frame and each said coupling means is connected to said frame by compliance means along the axis of said respective springs.

6. A line as defined in claim 2, wherein the mass of the selected two springs is substantially greater than the mass of said wire.

7. A line as defined in claim 2, wherein each said coupling means comprises one end of said selected two springs that essentially rotates about the spring axis in response to said rotational mode.

8. A line as defined in claim 1, wherein said two selected springs have substantially similar physical dimensions and acoustical transmission characteristics.

9. A line as defined in claim 1, wherein said two selected springs each have different delay times.

10. A line as defined in claim 1, wherein said two selected springs each have different impedance characteristics.

* * * * *